(12) United States Patent
Tsorng et al.

(10) Patent No.: US 10,645,837 B1
(45) Date of Patent: May 5, 2020

(54) ROTATING CARRIER

(71) Applicant: QUANTA COMPUTER INC., Taoyuan (TW)

(72) Inventors: Yaw-Tzorng Tsorng, Taoyuan (TW); Chun Chang, Taoyuan (TW); Zhi-Hao Tseng, Taoyuan (TW); Kai-Hsiang Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/228,298

(22) Filed: Dec. 20, 2018

(51) Int. Cl.
*H05K 7/14* (2006.01)
*G11B 33/04* (2006.01)

(52) U.S. Cl.
CPC ....... *H05K 7/1489* (2013.01); *G11B 33/0433* (2013.01); *H05K 7/1401* (2013.01); *H05K 7/1487* (2013.01)

(58) Field of Classification Search
None
See application file for complete search history.

(56) References Cited

U.S. PATENT DOCUMENTS

| | | | |
|---|---|---|---|
| 5,584,396 A | 12/1996 | Schmitt | |
| 6,097,591 A * | 8/2000 | Ircha | G06F 1/181 312/223.2 |
| 6,233,152 B1 * | 5/2001 | Abbott | G06F 1/184 312/223.1 |
| 6,404,642 B1 * | 6/2002 | Greenfield | G11B 33/022 361/679.33 |
| 7,257,827 B2 * | 8/2007 | Lee | G11B 33/022 312/223.2 |
| 7,643,280 B2 * | 1/2010 | Chen | G11B 33/123 361/679.33 |
| 9,258,916 B2 * | 2/2016 | Lu | H04Q 1/021 |
| 2002/0172003 A1 * | 11/2002 | Bang | G06F 1/181 361/679.58 |
| 2004/0190235 A1 * | 9/2004 | Chou | G06F 1/184 361/679.02 |
| 2005/0168932 A1 * | 8/2005 | Selvidge | G06F 1/184 361/679.33 |
| 2007/0019379 A1 * | 1/2007 | Hsiao | G06F 1/184 361/679.02 |
| 2007/0153469 A1 * | 7/2007 | Chen | G06F 1/187 361/679.31 |
| 2008/0298007 A1 * | 12/2008 | Chen | G11B 33/125 361/679.33 |
| 2012/0127649 A1 * | 5/2012 | Chen | H05K 7/1408 361/679.32 |
| 2013/0050963 A1 * | 2/2013 | Zhou | H02G 11/006 361/752 |

(Continued)

OTHER PUBLICATIONS

Extended European Search Report for EP Application No. 19180568.8, dated Dec. 2, 2019.

*Primary Examiner* — Xanthia C Cunningham
(74) *Attorney, Agent, or Firm* — Nixon Peabody LLP; Zhou Lu

(57) ABSTRACT

The present disclosure describes a server computer system having a chassis, a carrier, and a pivot member configured to connect the carrier to the chassis. The pivot member further permits the carrier to rotate between a first position with a first carrier end within the chassis, and a second position with the first carrier end extending out of the chassis.

16 Claims, 9 Drawing Sheets

(56) References Cited

U.S. PATENT DOCUMENTS

2013/0342990 A1* 12/2013 Jau .......................... G06F 1/18
                                                    361/679.39
2014/0369011 A1   12/2014  Jiang et al.
2015/0366095 A1   12/2015  Junkins et al.

* cited by examiner

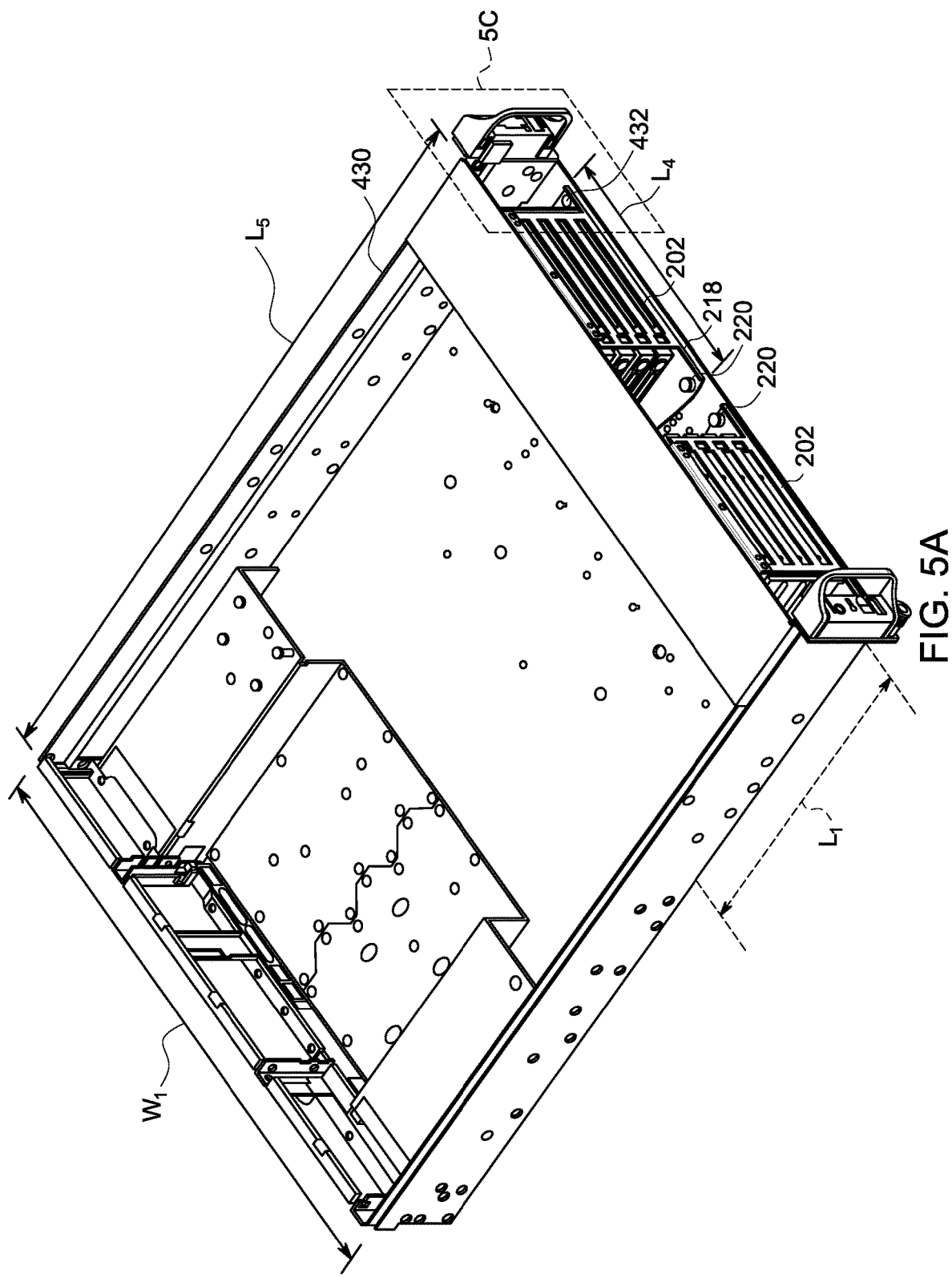

ROTATING CARRIER

FIELD OF THE INVENTION

The present invention relates to a carrier configured to hold computer components within a computer system, and more specifically, to a space-saving carrier within the computer system.

BACKGROUND

Conventional server computer systems are designed so that storage devices, such as hard disk drives, can be taken out of the chassis of server computer systems without stopping or shutting down operation (i.e., hot-swappable). In some conventional server computer systems, the storage devices can be housed within a carrier. FIG. 1 illustrates a conventional carrier 102 within a chassis 100 of a conventional server computer system. The conventional carrier 102 houses two hot-swappable storage devices 104. The carrier 102 has a length L1, which is the direction in which the storage devices 104 extend through the carrier 102, and from which they can be removed from the carrier 102. The conventional carrier 102 is designed to fit within the chassis of the conventional server computer system so that the length L1 is parallel to the length of the chassis. This presents the storage devices 104 to the front of the chassis for removal and insertion in the direction of arrow 112. This conventional arrangement can occupy a majority (if not all) of the length of a chassis of the server computer system.

Referring to FIG. 2, the length is taken up by the length L1 of the carrier 102 holding the storage devices 104; the length L2 of the connector 106 connected to an interface board 108; and the length L3 of cables 110 running the length of the chassis, which connects the storage devices 104 to the server computer system. The space occupied by the lengths L1-L3 of the carrier 102, the connectors 106, the interface board 108, and the cables 110 extending the length of the chassis, prevent other computer components from being added to conventional server computer systems.

Accordingly, there is a need for reducing the space required in the chassis of a server computer system for housing storage devices, in addition to other computer components, particularly for removable computer components within server computer systems.

SUMMARY

The present disclosure provides for a carrier that extends orthogonally or obliquely within the chassis of a server computer system. To allow one or more computer components within the chassis to be removed from the server computer system, the carrier is configured to rotate. Rotation of the carrier from a first position within the chassis to a second position, extends one end of the carrier outside of the chassis. In the second position, the computer components can be removed from, or inserted into, the carrier. The carrier having the orthogonal or oblique arrangement of the carrier provides space savings within the server computer system. Additionally, the carrier still provides the ability to hot-swap computer components from the server computer system.

According to one embodiment, a server computer system is disclosed that contains a chassis. The first chassis has a first chassis end, a second chassis end, and a chassis length from the first chassis end to the second chassis end. The server computer system further includes a carrier. The carrier has a first carrier end, a second carrier end, and a carrier length from the first carrier end to the second carrier end. The carrier is configured to house one or more computer components, and allows the one or more computer components to be removed from the first carrier end. The server computer system further includes a pivot member configured to connect the carrier to the chassis. The pivot member is further configured to allow the carrier to rotate between a first position, with the first carrier end within the chassis, and a second position with the first carrier end sticking out of the chassis.

According to some aspects of the embodiment, the carrier length can be orthogonal or oblique to the chassis length with the carrier in the first position. The pivot member can removably couple the carrier to the chassis. In such a case, the pivot member can be, for example, a screw, a nail, or a post. Alternatively, the pivot member can fixedly couple the carrier to the chassis. In such a case, the pivot member can be, for example, a rivet. The server computer system can further include at least one fastener configured to inhibit the carrier from rotating between the first position and the second position, with the at least one fastener in a coupled position. The carrier can include a flange. The at least one fastener can interface with the flange and the chassis in the coupled position to inhibit the carrier from rotating between the first position and the second position. The at least one fastener can be configured to allow the carrier to rotate between the first position and the second position, with the at least one fastener in a released position. In one or more embodiments, the one or more computer components can be a plurality of hot-swappable storage devices. The first carrier end can stick out of the first chassis end in the second position. The first chassis end can be at the front of the chassis, with the chassis located within a rackmount server chassis. The carrier can be configured to allow the one or more computer components to be removed by sliding out from the first carrier end. The server computer system can further include an interface board coupled to the carrier. The interface board can have a first side with one or more connectors configured to interface with the one or more components, and a second side with one or more connectors configured to interface with one or more cables of the server computer system. The first carrier end can stick out of the first chassis end in the second position, and the interface board can be connected to the carrier at the second carrier end.

According to another embodiment, a carrier for housing one or more computer components within a server computer system is disclosed. The housing has a first end, a second end, and a length from the first end to the second end. The carrier further includes a pivot member configured to connect the housing to a chassis of the server computer system. The pivot member is further configured to allow the housing to rotate between a first position with the first end within the chassis, and a second position with the first end sticking out of the chassis.

According to some aspects of the embodiment, the carrier further includes at least one fastener configured to inhibit the housing from rotating between the first position and the second position, with the at least one fastener in a coupled position. The housing can include a flange. The at least one fastener can interface with the flange and the chassis in the coupled position to inhibit the carrier from rotating between the first position and the second position. The carrier can further include an interface board coupled to the housing. The interface board can have a first side with one or more connectors configured to interface with the one or more components, and a second side with one or more connectors configured to interface with one or more cables of the server computer system. The pivot member can removably couple the housing to the chassis. Alternatively, the pivot member can fixedly couple the housing to the chassis.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments and are, therefore, not to be considered as limitations on the scope of the various embodiments or claims.

FIG. 5A illustrates an isometric view of the first position of a carrier, according to one embodiment of the present disclosure within a chassis.

DETAILED DESCRIPTION

Figure 1:
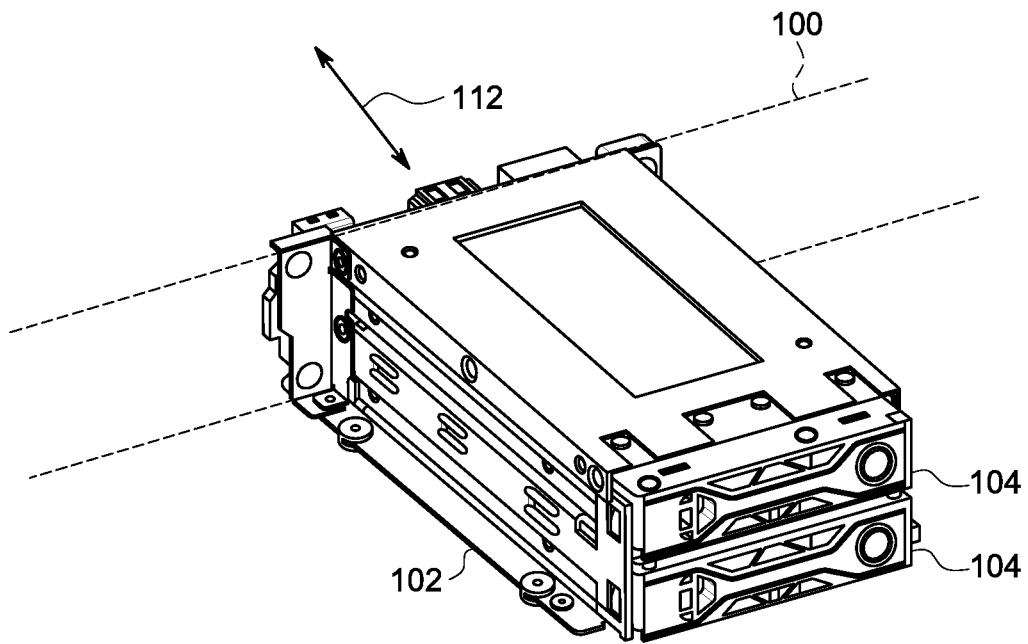
FIG. 1 illustrates an isometric view of a conventional carrier housing two storage devices.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device," "computing system," and "computer system" refer to any electronically-powered or battery-powered equipment that has hardware, software, and/or firmware components, where the software and/or firmware components can be configured for operating features on the device. With regards to the present disclosure, the term "operating environment" can refer to any operating system or environment that functions to allow software to run on a computer system.

As discussed above, the present disclosure provides for a carrier extends orthogonally or obliquely within the chassis of a server computer system. The orthogonal or oblique arrangement of the carrier provides space savings within the server computer system. Additionally, the carrier still provides the ability to hot-swap computer components from the server computer system.

The carrier is configured to be rotatable within the chassis. The rotation allows the carrier to be orthogonal or oblique in the chassis for space savings but still be able to provide for the hot-swapping of computer components. Specifically, the carrier within the chassis in a first position provides space savings. The carrier rotated to a second position, with one end partially sticking out from the chassis, provides access for removal and insertion of computer components from the housing. The carrier is connected to the chassis by a pivot member. The carrier rotates about the pivot member to rotate from the first position to and second position, and back.

Figure 3A:
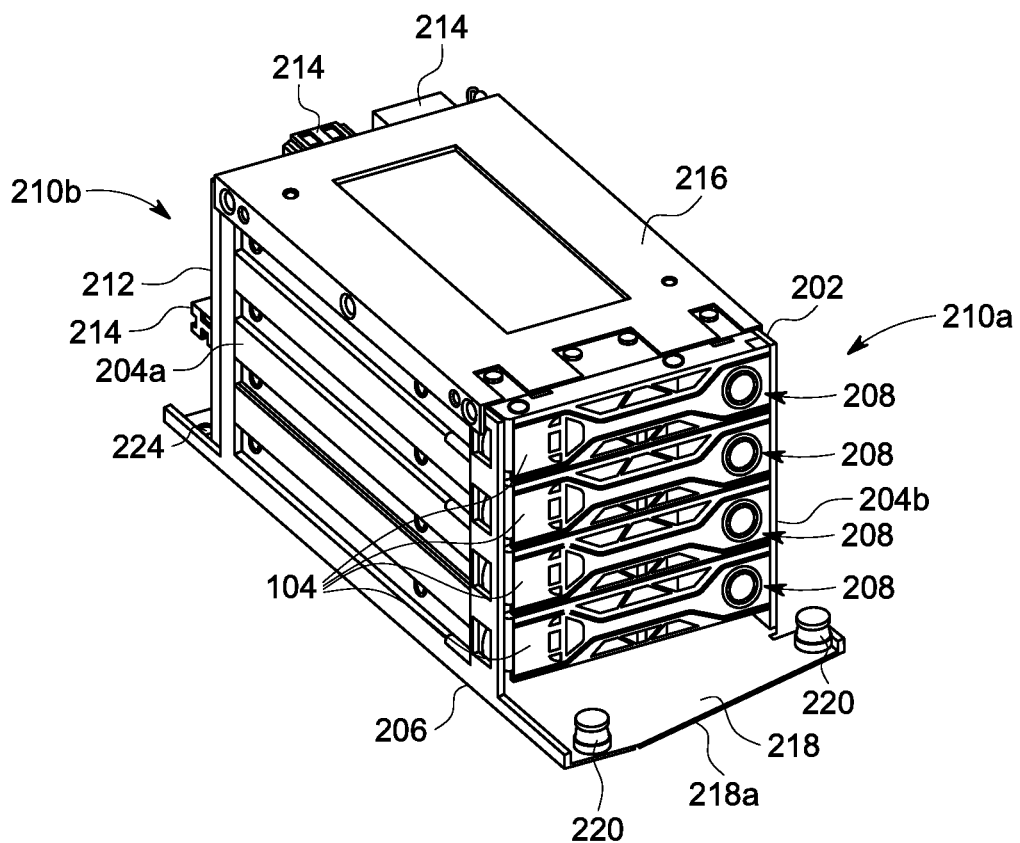
FIG. 3A illustrates a carrier according to one embodiment of the present disclosure.
Figure 3B:
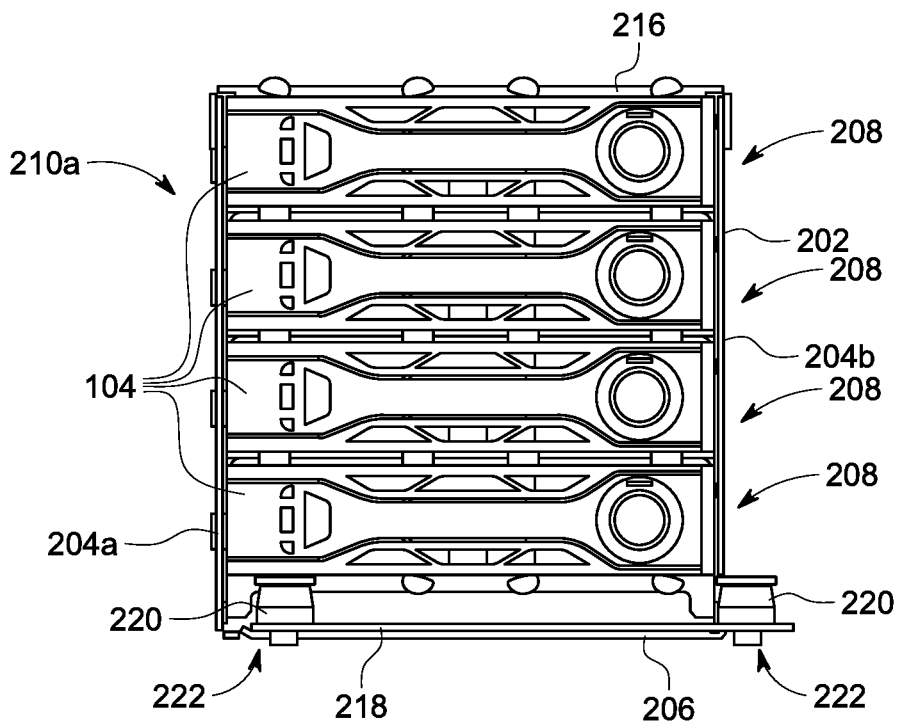
FIG. 3B illustrates an end view of the carrier of FIG. 3A.

FIGS. 3A and 3B illustrate an isometric view and an end view, respectively, of a carrier 202 according to one embodiment of the present disclosure. Referring to FIG. 3A, the carrier 202 has opposite walls 204a and 204b connected to a plate 206. The walls 204a and 204b define slots 208 that accept computer components, such as the illustrated storage devices 104. Although four storage devices 104 are illustrated, the walls 204a and 204b, and the carrier 202 in general, can include more or less slots 208 to enclose more or less storage devices 104. Further, although storage devices 104 are shown, the carrier 202 can enclose various other computer components, not just storage devices. In one or more embodiments, the computer components can be any hot-swappable component.

The carrier 202 includes ends 210a and 210b. The end 210a is open to allow the computer components to be slid into and out of the slots 208 of the carrier 202. The end 210b includes an interface board 212 for connecting the computer components 104 to the server computer system (FIGS. 4A-5B, discussed below). The interface board 212 includes interfaces (not shown) on a component side (e.g., facing the carrier 202) to connect to the computer components 104; and interfaces 214 on a chassis side (e.g., facing away from the carrier 202) to connect to cables (discussed below) of the server computer system.

In one or more embodiments, the carrier 202 can include a plate 216 for extra rigidity. However, in one or more embodiments, the plate 216 can be omitted.

The plate 206 includes a flange 218. As shown in FIG. 3A, the flange 218 extends out beyond the computer components 104. In one or more embodiments, rather than having a flat front, the front 218a of the flange 218 can be curved or angled to reduce the clearance needed for the flange 218, when the carrier 202 is rotated between the first and second positions, discussed below. The flange 218 includes one or more apertures 222 (FIG. 3B) that accept one or more fasteners 220. The fasteners 220 are configured to secure the carrier 202 within a chassis (FIGS. 4A-5B, discussed below) and inhibit the carrier 202 from rotating between first and second positions, described below.

The plate 206 has an aperture 224 at the end 210b opposite from the flange 218. The aperture 224 allows a pivot member (discussed below) to connect the carrier 202 to a chassis, and also allow the carrier 202 to pivot about the pivot member, as further described below.

Figure 4B:
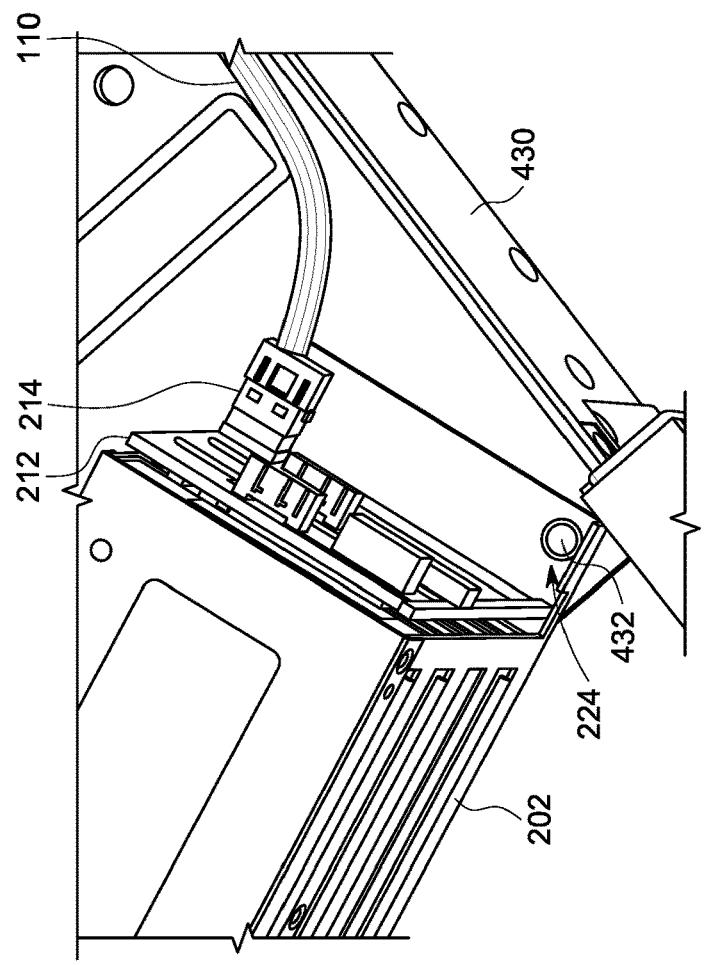
FIG. 4B illustrates a second position of the carrier of FIG. 4A partially rotated out from the chassis.
Figure 4A:
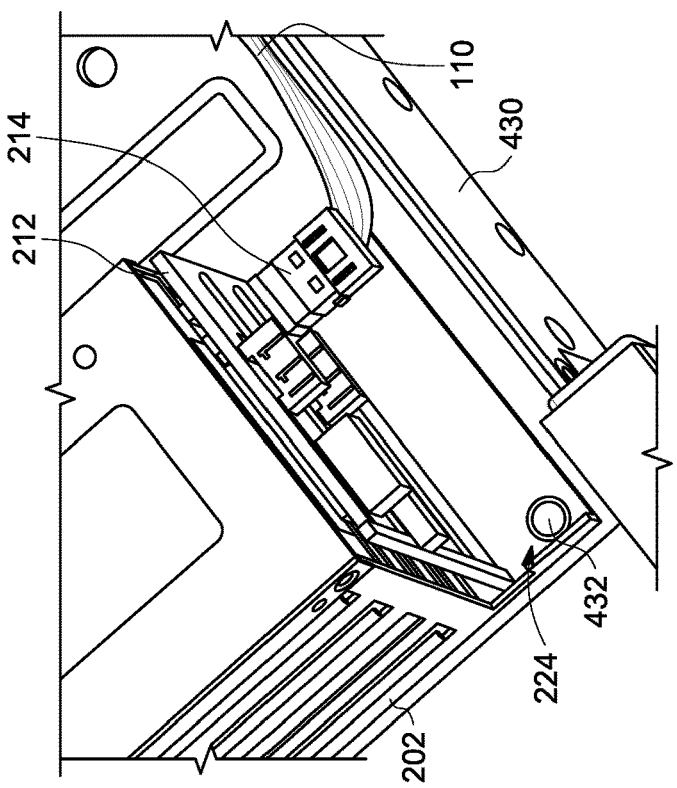
FIG. 4A illustrates a first position of a carrier within a chassis, according to one embodiment of the present disclosure.

FIG. 4A illustrates the carrier 202 in a first position and connected to a chassis 430 of a server computer system, according to one embodiment of the present disclosure. FIG. 4B illustrates the carrier 202 connected to the chassis 430 in a second position. Referring to FIG. 4A, the carrier 202 is connected to the chassis 430 by a pivot member 432 extending through the aperture 224. The pivot member 432 allows the carrier 202 to rotate from a first position, as shown in FIG. 4A, to a second position, as shown in FIG. 4B.

In one or more embodiments, the pivot member 432 can removably couple the carrier 202 to the chassis 430. For example, the pivot member 432 can be configured to allow the carrier 202 to disengage from the chassis 430. In which case, the carrier 202 can be removed from the chassis 430. A pivot member 432 that removably couples the carrier 202 to the chassis 430 can be, for example, a screw, a nail, a post, or any other mechanical fastener that allows the carrier 202 to disengage and be removed from the chassis 430.

Alternatively, in one or more embodiments, the pivot member 432 can fixedly couple the carrier 202 to the chassis 430. For example, the pivot member 432 can be configured to inhibit the carrier 202 from disengaging from the chassis 430. A pivot member 432 that fixedly couples the carrier 202 to the chassis 430 can be, for example, a rivet or any other fastener that inhibits the carrier 202 from being removed from the chassis 430 without, for example, damaging or destroying the pivot member 432.

With the carrier 202 in the first position, as illustrated in FIG. 4A, the carrier 202 is entirely enclosed within the chassis 430. However, with the carrier 202 rotated about the pivot member 432 to the second position, as illustrated in FIG. 4B, the carrier 202 partially extends out from the chassis 430.

In both the first position and the second position, the interface board 212 allows the cables 110 of the server computer system to remain connected to the carrier 202 to maintain a connection within the storage devices 104 within the carrier. The carrier 202 being enclosed within the chassis 430 in the first position, and partially extending out of the chassis 430 in the second position, is further shown in FIGS. 5A and 5B.

Figure 5B:
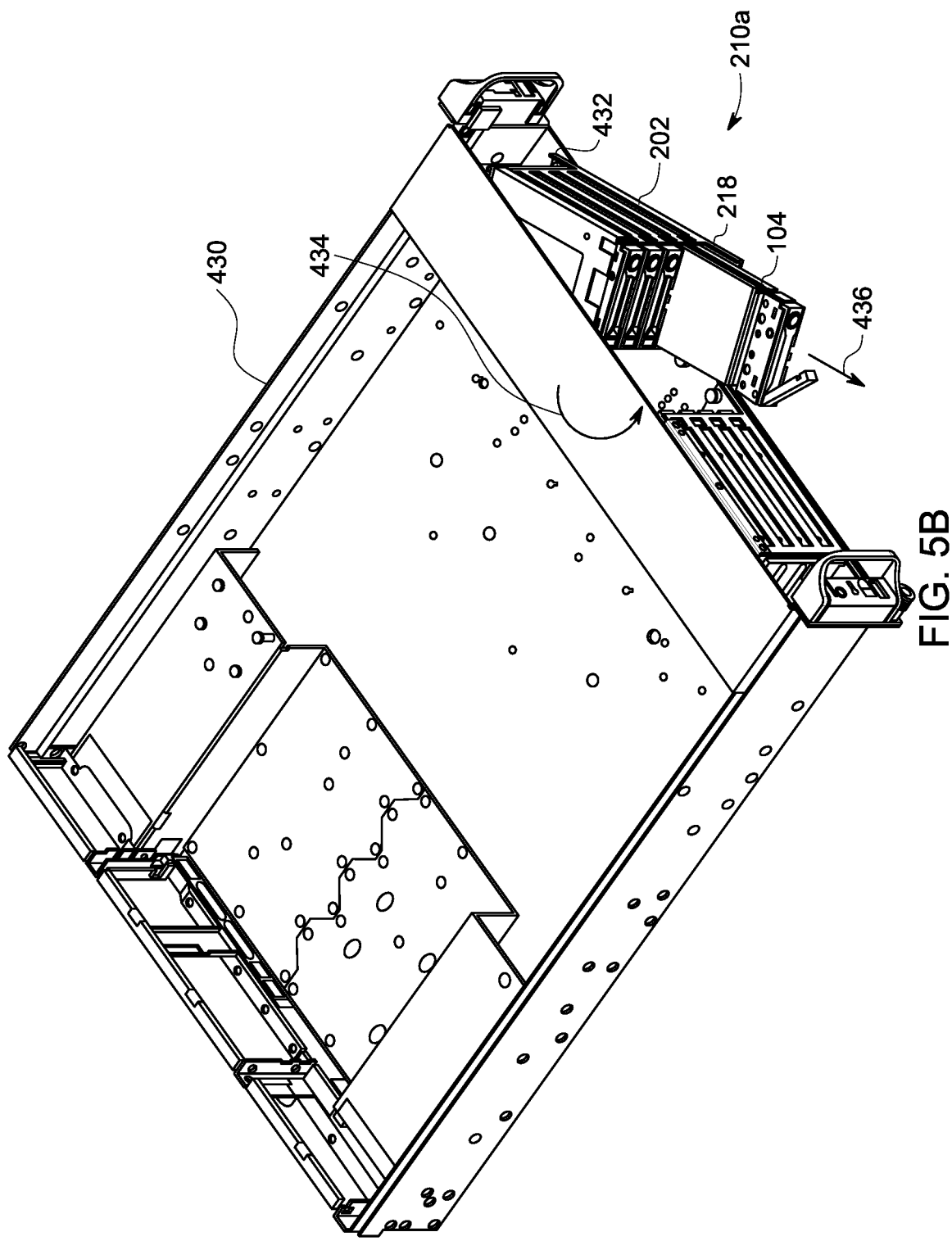
FIG. 5B illustrates an isometric view of the second position of the carrier of FIG. 5A partially rotated out from the chassis.
Figure 5C:
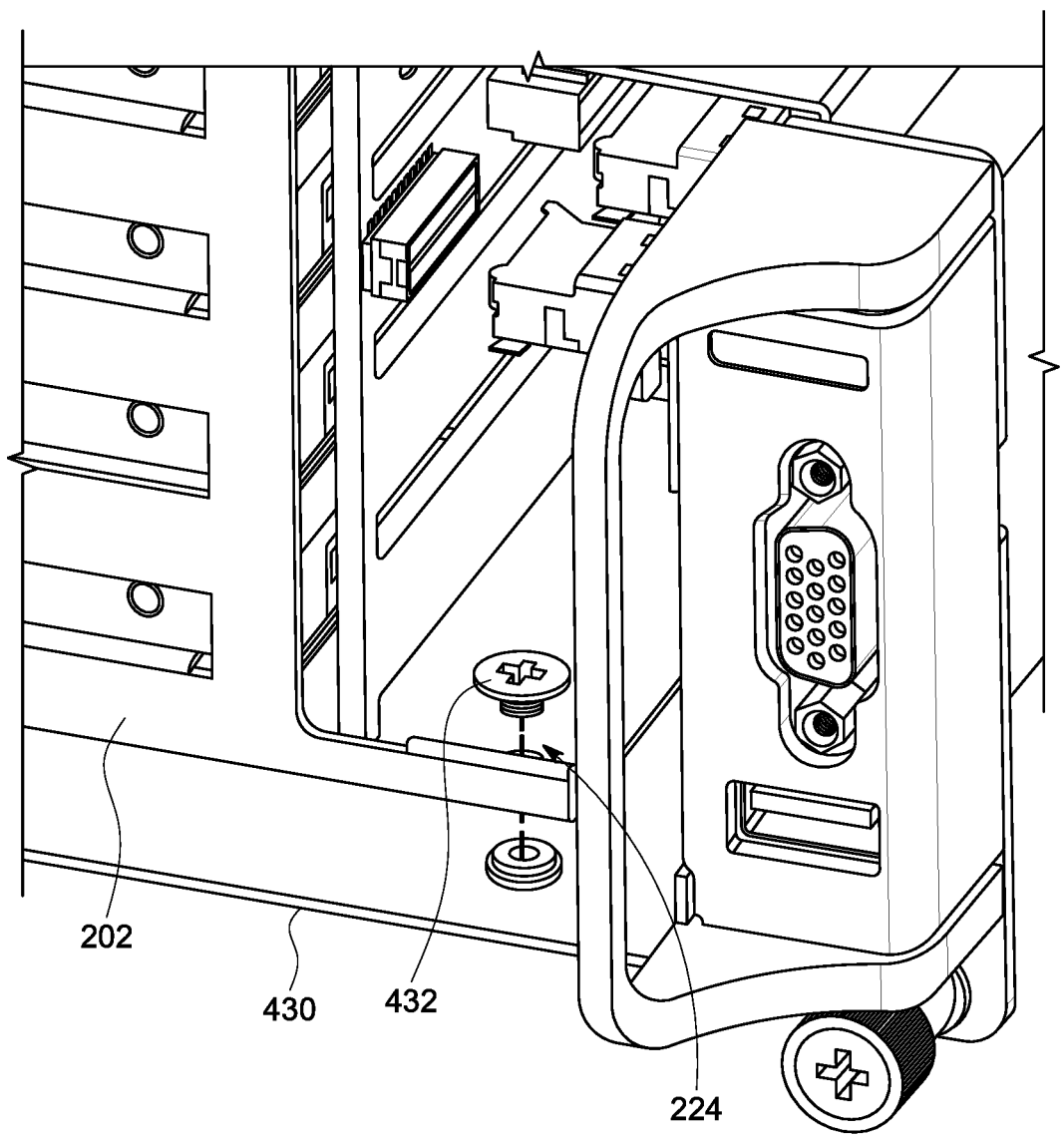
FIG. 5C illustrates a detailed isometric view of the portion 5C of FIG. 5A.

FIG. 5A illustrates an isometric view of the first position of the carrier 202 relative to the chassis 430. FIG. 5B illustrates an isometric view of the second position of the carrier 202 partially rotated out from the chassis 430. FIG. 5C illustrates a detailed isometric view of the portion 5C of FIG. 5A. As shown in FIGS. 5A and 5C, the entire carrier 202 is within the chassis 430 in the first position and connected to the chassis 430 by the pivot member 432. Further, the length L4 of the carrier 202 is orthogonal to the length L5 of the chassis 430. The length L4 of the carrier 202, being orthogonal to the length L5 of the chassis 430, takes up less depth within the chassis 430 than if the length L4 is parallel to the length L5.

Figure 2:
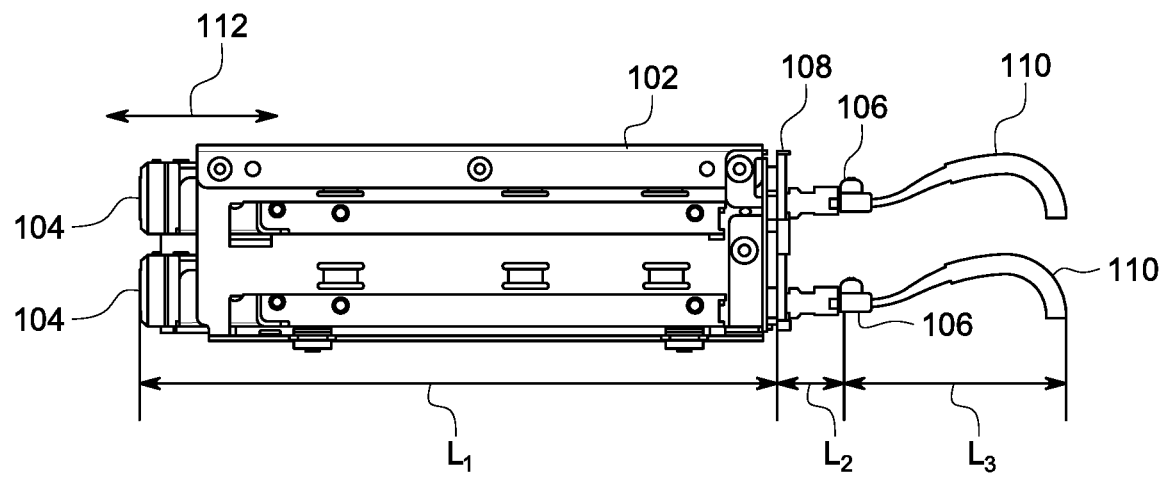
FIG. 2 illustrates a side view of the conventional carrier of FIG. 1 housing the two storage devices, along with two connectors and associated cables.

More specifically, for an arrangement of a conventional carrier within a chassis, such as the carrier 102 discussed above with respect to FIGS. 1 and 2, the length of the carrier is parallel to the length of the chassis, not orthogonal. Further, referring back to the lengths shown in FIG. 2, the length L1 can be 140 mm; the length L2 can be 20 mm; and the length L3 can be 40 mm. Thus, the total length of the conventional carrier 102 requires is about 200 mm. With the length L1 of the conventional carrier 102 arranged parallel to the length L5 of the chassis 430, the conventional carrier 102 would require a majority of the depth of the chassis 430. In contrast, the orthogonal arrangement of the carrier 202 within the chassis 430 shown in FIG. 5A merely requires the width of the carrier 202, which can be about 80 mm. Thus, the orthogonal arrangement of the carrier 202 within the chassis 430 conserves about 100 mm to 120 mm of depth within the chassis for other computer components. Yet, with the pivot member 432, the carrier 202 is still configured to provide access to computer components housed within the carrier 202 (e.g., storage devices 104) by being able to rotate relative to the chassis 430.

Referring to FIG. 5B, the carrier 202 is configured to rotate about the pivot member 432 in the direction of arrow 434 from the first position (FIG. 5A) to the second position (FIG. 5B). With the carrier 202 rotated about the pivot member 432 in the second position (FIG. 5B), the end 210a of the carrier 202 extends out from the chassis 430. This second position provides access to the storage devices 104 that are within the carrier 202. Thus, one or more of the storage devices 104 can be removed from carrier 202, as shown by the arrow 436. However, the storage devices 104 remaining within the carrier 202 can remain connected to the server computer system, based on the cables 110 and the interface board 212 (FIG. 4B). The cables 110 can have slack that is taken up with the carrier 202 in the second position and still be connected to the interface. Although the carriers 202 are illustrated as being rotated from the center of the chassis 430 in FIG. 5B, alternatively, arrangement of the carriers 202 in the chassis 430 can be reversed. Specifically, the carriers 202 can be rotated from the sides of the chassis 430. The carrier 202 is able to rotate enough to allow for removal of the storage devices 104. Thus, in one or more embodiments, the carrier 202 is able to rotate about the width of the storage devices 104 so that they clear the other components within the chassis 430, such as the other carrier 202 illustrated in FIG. 5B. However, the carrier 202 can rotate more than the width of the storage device 104. For example, the carrier can rotate up to or beyond 90°. The rotation can be limited only by, for example, the length of the cables 110, the chassis 430 abutting the carrier 202, and the like, if the rotation is limited at all.

The space savings that are achieved by the length L4 of the carrier 202 being orthogonal to the length L5 of the chassis provides additional space within the chassis 430 for additional computer components. Moreover, the width W1 of the chassis 430 compared to the length L4 of the carrier 202 can provide for a second carrier 202 within the chassis 430, as shown in FIGS. 5A and 5B.

Despite being able to move from the first position (FIG. 5A) to the second position (FIG. 5B), in one or more embodiments, the carrier 202 can include one or more fasteners 220 that secure the carrier 202 to the chassis 430 and inhibit movement between the first and second positions. With the carrier 202 in the first position (FIG. 5A), the fastener 220 can secure the flange 218 to the chassis 430. In particular, the fastener 220 can be in a coupled position with the carrier 202 in the first position. This inhibits the flange 218 and the carrier 202 from rotating between the first and second positions. Changing the fastener 220 to a de-coupled or released position allows the carrier 202 to rotate from the first position to the second position (FIG. 5B).

Although only one fastener is shown in FIG. 5A, the flange 218 can have more than one fastener 220, as shown in FIG. 3B. The fastener 220 can be any mechanical fastener that permits the flange 218 to be coupled to, and de-coupled from (e.g., released), the chassis 430. For example, the fastener 220 can be a screw, a hook, and the like. Further, there can be more than one fastener 220.

In one or more embodiments, the chassis 430 can have a track or guide that can assist the carrier 202 rotating relative to the chassis 430. For example, the carrier 202 can have a projection that interfaces with the track or guide to assist the rotation of the carrier 202. However, the track or guide can be optional, particularly depending on the amount of available space within the chassis 430.

Figure 6:
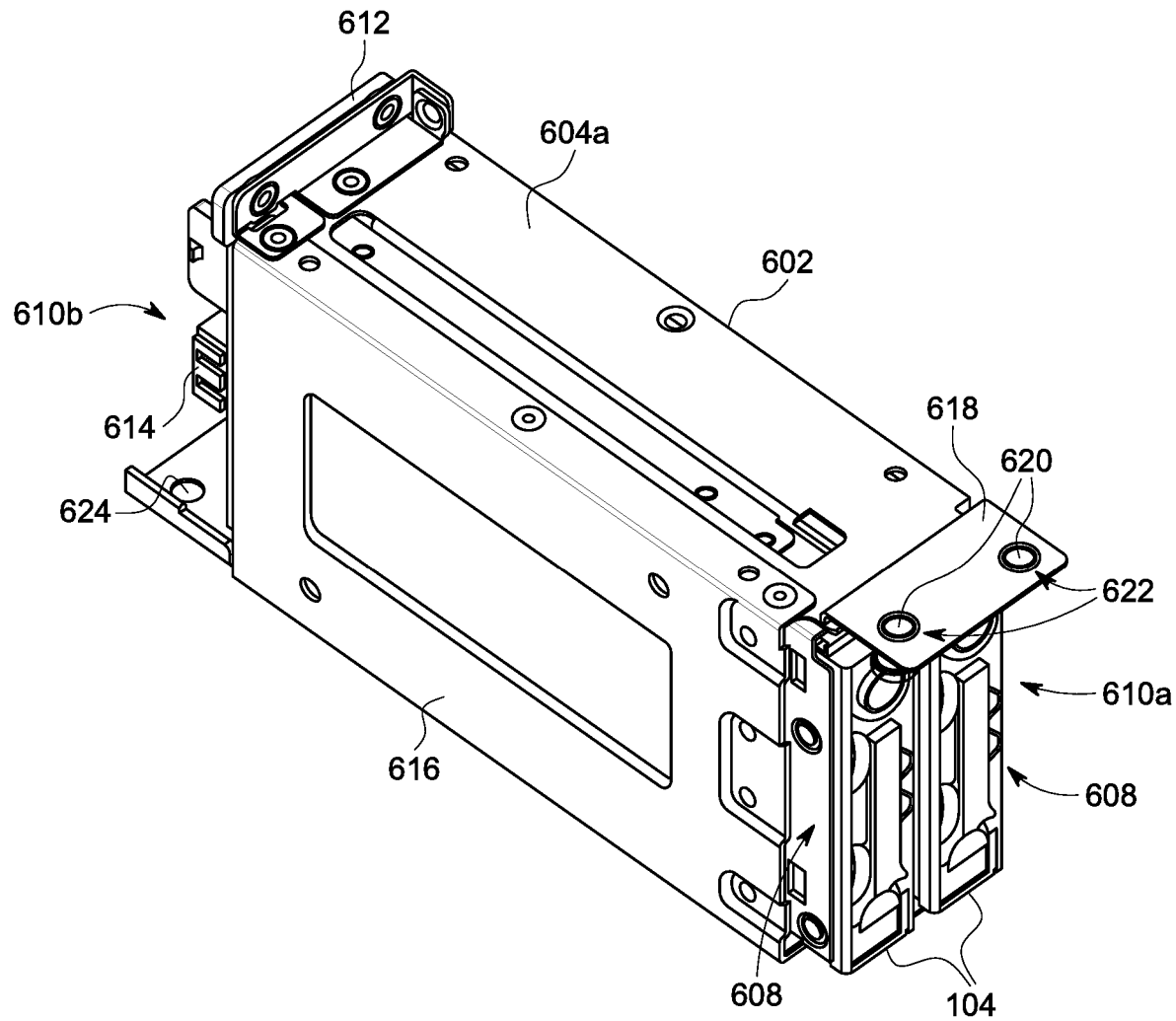
FIG. 6 illustrates a carrier according to another embodiment of the present disclosure.

FIG. 6 illustrates a carrier 602 according to another embodiment of the present disclosure. The carrier 602 has similar features as the carrier 202 discussed above. Thus, similar features are numbered according to a similar numbering scheme. The disclosure above with respect to the carrier 202 and its corresponding features applies to the features of the carrier 602, unless otherwise noted. The carrier 202 arranges the storage devices 104 adjacent to each other vertically in a horizontal orientation, whereas the carrier 602 arranges the storage devices 104 adjacent to each other horizontally in vertical orientation.

The carrier 602 has opposite walls 604a and 604b (not shown) connected to a plate 606 (not shown). The walls 604a and 604b and the plate 606 are similar to the walls 204a and 204b and the plate 206 except rotated 90 degrees; such that the walls 604a and 604b define the top and bottom, respectively, of the carrier 602, and the plate 606 defines the side of the carrier 606.

The walls 604a and 604b define slots 608 that accept computer components, such as the illustrated storage devices 104. Although two storage devices 104 are illustrated, the walls 604a and 604b, and the carrier 602 in general, can include more or less slots 608 to enclose more or less storage devices 104. Further, although storage devices 104 are shown, the carrier 602 can enclose various other computer components, not just storage devices. In one or more embodiments, the computer components can be any hot-swappable component.

Figure 7A:
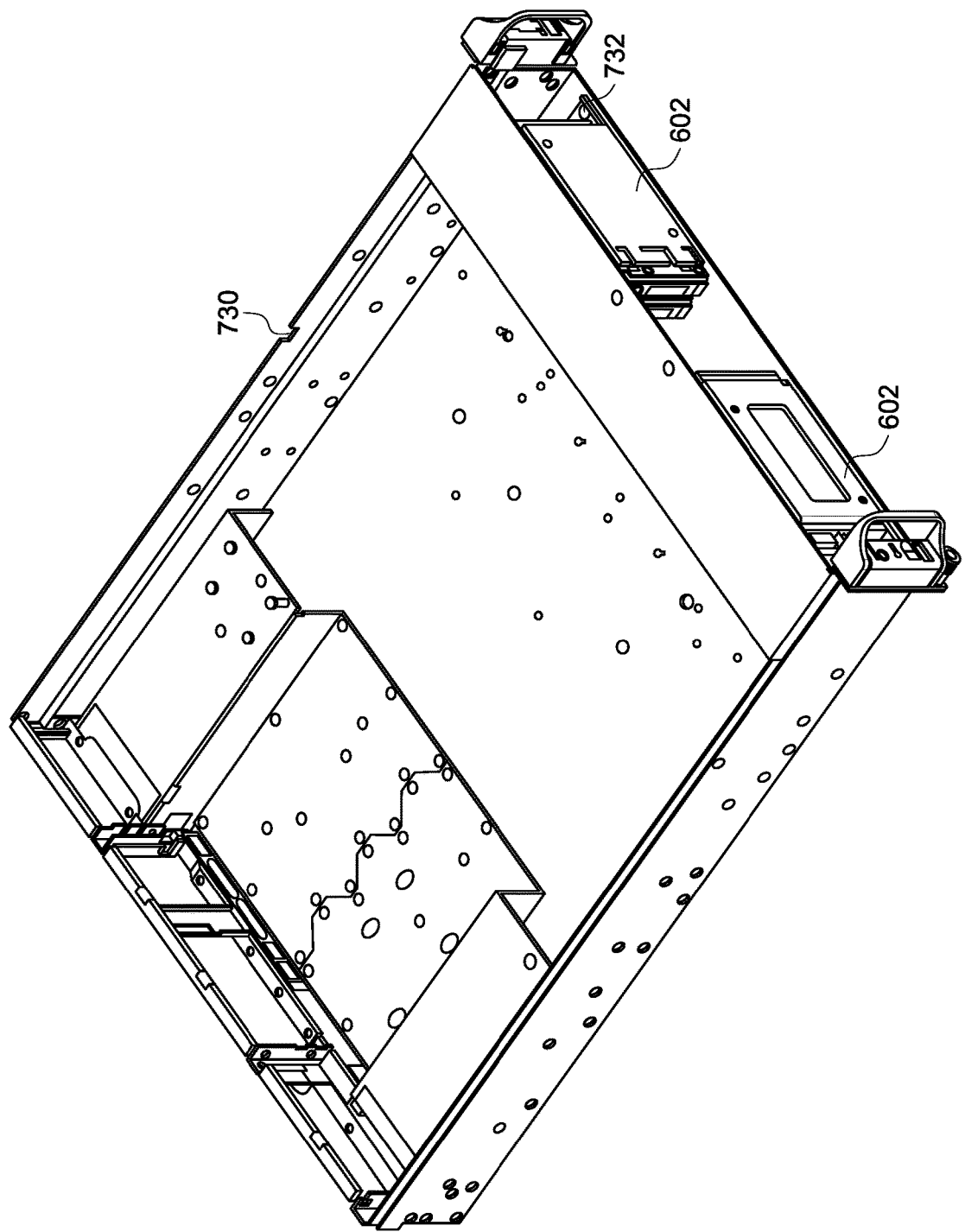
FIG. 7A illustrates an isometric view of the first position of the carrier of FIG. 6, according to one embodiment of the present disclosure within a chassis.
Figure 7B:
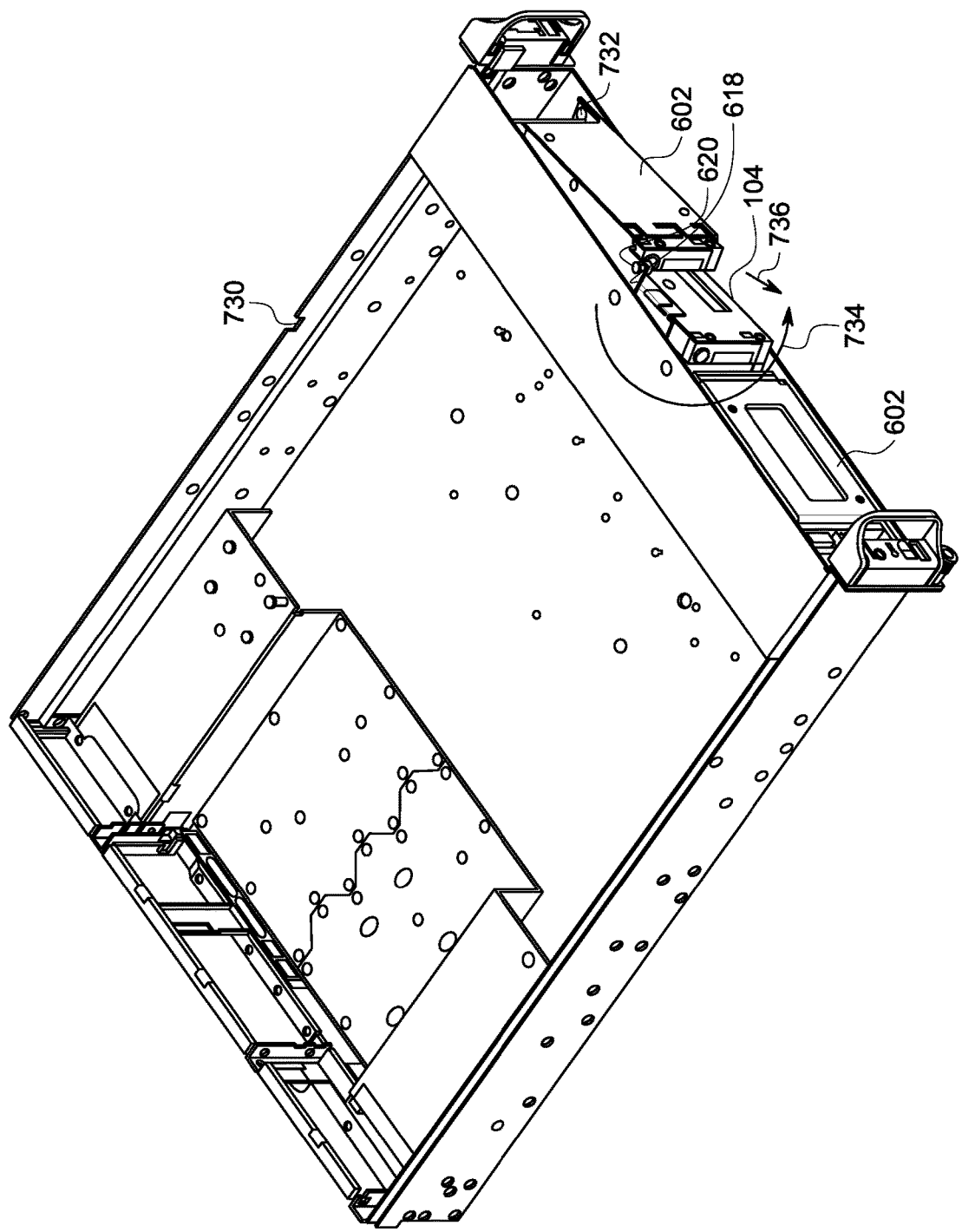
FIG. 7B illustrates an isometric view of the second position of the carrier of FIG. 7A partially rotated out from the chassis.

The carrier 602 includes ends 610a and 610b. The end 610a is open to allow the computer components to be slid into and out of the slots 608 of the carrier 602. The end 610b includes an interface board 612 for connecting the computer components 104 to the server computer system (FIGS. 7A and 7B, discussed below). The interface board 612 includes interfaces (not shown) on a component side (e.g., facing the carrier 602) to connect to the computer components 104; and interfaces 614 on a chassis side (e.g., facing away from the carrier 602) to connect to cables (discussed below) of the server computer system.

In one or more embodiments, the carrier 602 can include a plate 616 for extra rigidity. However, in one or more embodiments, the plate 616 can be omitted.

The wall 604a includes a flange 618. The flange 618 extends out beyond the computer components 104. The flange 618 includes one or more apertures 622 that accept one or more fasteners 620. The fasteners 620 are configured to secure the carrier 602 within a chassis (FIGS. 7A and 7B, discussed below) and inhibit the carrier 602 from rotating between first and second positions, described below.

The wall 604a has an aperture 624 at the end 610b opposite from the flange 618. The aperture 624 allows a pivot member (discussed below) to connect the carrier 602 to a chassis, and also allow the carrier 602 to pivot about the pivot member, as further described below.

With the number of storage devices 104 being below a threshold number, depending on the widths of the storage devices 104, the width of the carrier 602 can be even less than the width of the carrier 202. Thus, the carrier 602 can provide even greater depth savings.

FIG. 7A illustrates an isometric view of the first position of the carrier 602 of FIG. 6, according to one embodiment of the present disclosure within a chassis. FIG. 7B illustrates an isometric view of the second position of the carrier 602 partially rotated out from a chassis 730. As shown in FIG. 7A, the entire carrier 602 is within the chassis 730 in the first position. Further, the length L4 of the carrier 602 is orthogonal to the length L5 of the chassis 730. The length L4 of the carrier 602, being orthogonal to the length L5 of the chassis 730, takes up less depth within the chassis 730 than if the length L4 is parallel to the length L5.

More specifically, for an arrangement of a conventional carrier within a chassis, such as the carrier 102 discussed above with respect to FIGS. 1 and 2, the length of the carrier is parallel to the length of the chassis, not orthogonal. Further, referring back to the lengths shown in FIG. 2, the length L1 can be 140 mm; the length L2 can be 20 mm; and the length L3 can be 40 mm. Thus, the total length of the conventional carrier 102 requires is about 200 mm. With the length L1 of the conventional carrier 102 arranged parallel to the length L5 of the chassis 730, the conventional carrier 102 would require a majority of the depth of the chassis 730. In contrast, the orthogonal arrangement of the carrier 602 within the chassis 730 shown in FIG. 7A merely requires the width of the carrier 602, which can be about 42 mm. Thus, the orthogonal arrangement of the carrier 602 within the chassis 730 conserves about 140 mm to 160 mm of depth within the chassis 730 for other computer components. Yet, with the pivot member 732, the carrier 602 is still configured to provide access to computer components housed within the carrier 602 (e.g., storage devices 104) by being able to rotate relative to the chassis 730.

Referring to FIG. 7B, the carrier 602 is configured to rotate about the pivot member 732 in the direction of arrow 734 from the first position (FIG. 7A) to the second position (FIG. 7B). With the carrier 602 rotated about the pivot member 732 in the second position (FIG. 7B), the end 610a of the carrier 602 extends out from the chassis 730. This second position provides access to the storage devices 104 that are within the carrier 602. Thus, one or more of the storage devices 104 can be removed from carrier 602, as shown by the arrow 736. However, the storage devices 104 remaining within the carrier 602 can remain connected to the server computer system, based on the corresponding cables and the interface board 612 (similar to FIG. 4B). The cables can have slack that is taken up with the carrier 602 in the second position and still be connected to the interface. Although the carriers 602 are illustrated as being rotated from the center of the chassis 730 in FIG. 7B, alternatively, arrangement of the carriers 602 in the chassis 730 can be reversed. Specifically, the carriers 602 can be rotated from the sides of the chassis 730. The carrier 602 is able to rotate enough to allow for removal of the storage devices 104. Thus, in one or more embodiments, the carrier 602 is able to rotate about the width of the storage devices 104 so that they clear the other components within the chassis 730, such as the other carrier 602 illustrated in FIG. 7B. However, the carrier 602 can rotate more than the width of the storage device 104. For example, the carrier can rotate up to or beyond 90°. The rotation can be limited only by, for example, the length of the cables, the chassis 730 abutting the carrier 602, and the like, if the rotation is limited at all.

Despite being able to move from the first position (FIG. 5A) to the second position (FIG. 5B), in one or more embodiments, the carrier 602 can include one or more fasteners 620 that secure the carrier 602 to the chassis 730 and inhibit movement between the first and second positions. With the carrier 602 in the first position (FIG. 7A), the fastener 620 can secure the flange 618 to the chassis 730. In particular, the fastener 620 can be in a coupled position with the carrier 602 in the first position. This inhibits the flange 618 and the carrier 602 from rotating between the first and second positions. Changing the fastener 620 to a de-coupled or released position allows the carrier 602 to rotate from the first position to the second position (FIG. 7B).

Although only one fastener is shown in FIG. 7A, the flange 618 can have more than one fastener 620, as shown in FIG. 5B. The fastener 620 can be any mechanical fastener that permits the flange 618 to be coupled to, and de-coupled from (e.g., released), the chassis 730. For example, the fastener 620 can be a screw, a hook, and the like. Further, there can be more than one fastener 620.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A server computer system comprising:
    a chassis having a first chassis end, a second chassis end, and a chassis length from the first chassis end to the second chassis end;
    a carrier having a first carrier end, a second carrier end, and a carrier length from the first carrier end to the second carrier end, the carrier being configured to house one or more computer components, and allow the one or more computer components to be removed from the first carrier end;
    a pivot member being configured to connect the carrier to the chassis, and allow the carrier to rotate between a first position with the first carrier end within the chassis, and a second position with the first carrier end extending out of the chassis; and
    at least one fastener configured to inhibit the carrier from rotating between the first position and the second position with the at least one fastener in a coupled position, wherein the carrier includes a flange, and wherein the at least one fastener interfaces with the flange and the chassis in the coupled position to inhibit the carrier from rotating between the first position and the second position.

2. The server computer system of claim 1, wherein the carrier length is orthogonal or oblique to the chassis length with the carrier in the first position.

3. The server computer system of claim 1, wherein the pivot member removably couples the carrier to the chassis.

4. The server computer system of claim 3, wherein the pivot member is a screw, a nail, or a post.

5. The server computer system of claim 1, wherein the pivot member fixedly couples the carrier to the chassis.

6. The server computer system of claim 5, wherein the pivot member is a rivet.

7. The server computer system of claim 1, wherein the at least one fastener is configured to allow the carrier to rotate between the first position and the second position, with the at least one fastener in a released position.

8. The server computer system of claim 1, wherein the one or more computer components are a plurality of hot-swappable storage devices.

9. The server computer system of claim 1, wherein the first carrier end sticks out of the first chassis end in the second position, and the first chassis end is a front of the chassis with the chassis within a rackmount server chassis.

10. The server computer system of claim 1, wherein the carrier is configured to allow the one or more computer components to be removed by sliding out from the first carrier end.

11. The server computer system of claim 1, further comprising:
    an interface board coupled to the carrier, the interface board having a first side with one or more connectors configured to interface with the one or more components, and a second side with one or more connectors configured to interface with one or more cables of the server computer system.

12. The server computer system of claim 11, wherein the first carrier end sticks out of the first chassis end in the second position, and the interface board is connected to the carrier at the second carrier end.

13. A carrier for housing one or more computer components within a server computer system, the carrier comprising:
    a housing having a first end, a second end, and a length from the first end to the second end;

a pivot member configured to connect the housing to a chassis of the server computer system and allow the housing to rotate between a first position with the first end within the chassis, and a second position with the first end sticking out of the chassis; and at least one fastener configured to inhibit the housing from rotating between the first position and the second position, with the at least one fastener in a coupled position, wherein the housing includes a flange, and wherein the at least one fastener interfaces with the flange and the chassis in the coupled position to inhibit the carrier from rotating between the first position and the second position.

14. The carrier of claim 13, further comprising:

an interface board coupled to the housing, the interface board having a first side with one or more connectors configured to interface with the one or more components, and a second side with one or more connectors configured to interface with one or more cables of the server computer system.

15. The carrier of claim 13, wherein the pivot member removably couples the housing to the chassis.

16. The carrier of claim 13, wherein the pivot member fixedly couples the housing to the chassis.

* * * * *